US006603415B1

(12) United States Patent
Somayajula

(10) Patent No.: US 6,603,415 B1
(45) Date of Patent: Aug. 5, 2003

(54) CIRCUITS AND METHODS FOR LATCH METASTABILITY DETECTION AND COMPENSATION AND SYSTEMS USING THE SAME

(75) Inventor: Shyam S Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/919,411

(22) Filed: Jul. 30, 2001

(51) Int. Cl.[7] ................................................. H03M 1/06
(52) U.S. Cl. ......................... 341/118; 341/172; 326/94
(58) Field of Search ................................ 341/143, 118, 341/120, 119, 172, 156, 165, 169, 159; 330/253; 326/94, 93, 124, 38; 327/215

(56) References Cited

U.S. PATENT DOCUMENTS

| 4,200,863 A | * | 4/1980 | Hodges et al. ............... 341/172 |
| 5,032,744 A | * | 7/1991 | Wai Yeung Liu ............ 326/124 |
| 5,272,481 A | * | 12/1993 | Sauer ........................... 341/165 |
| 5,291,198 A | * | 3/1994 | Dingwall et al. ............ 341/159 |
| 5,589,782 A | * | 12/1996 | Sharpe-Geisler ............. 326/38 |
| 5,684,487 A | * | 11/1997 | Timko ......................... 341/172 |
| 5,760,609 A | * | 6/1998 | Sharpe-Geisler ............. 326/93 |
| 5,789,945 A | * | 8/1998 | Cline .......................... 326/94 |
| 6,060,912 A | * | 5/2000 | Opris et al. ................. 327/215 |
| 6,225,937 B1 | * | 5/2001 | Butler ......................... 341/169 |
| 6,326,846 B1 | * | 12/2001 | Brandt ........................ 330/253 |
| 6,356,117 B1 | * | 3/2002 | Sutherland et al. .......... 326/93 |

* cited by examiner

Primary Examiner—Jean Bruner Jeanglaude
(74) Attorney, Agent, or Firm—James J. Murphy, Esq.; Winstead Sechrest & Minick, P.C.

(57) ABSTRACT

Metastable compensation circuitry 700 for detecting and compensating for metastable states of a regenerative latch 209 in a charge redistribution analog to digital converter 201. First and second latches 701*a,b* each having a selected threshold voltage for monitor corresponding first and second outputs of regenerative latch 209. Detection logic 202*a,b* 703 detects a selected output state of the first and second latches corresponding to a metastable state of regenerative latch 209. Suppression logic 703 generates an output of a selected logic level in response to the detection of a metastable state by detection logic 702/703.

18 Claims, 5 Drawing Sheets

CIRCUITS AND METHODS FOR LATCH METASTABILITY DETECTION AND COMPENSATION AND SYSTEMS USING THE SAME

CROSS-REFERENCE TO RELATED APPLICATIONS

This application for patent is related to the following applications for patent:

U.S. patent application Ser. No. 09/919,181, filed Jul. 30, 2001, entitled "CIRCUITS AND METHODS FOR OFFSET VOLTAGE COMPENSATION IN A CHARGE REDISTRIBUTION ANALOG TO DIGITAL CONVERTER" by inventor Shyam S. Somayajula currently pending;

U.S. patent application Ser. No. 09/919,014, filed Jul. 30, 2001 by inventor Somayajula, entitled "A HIGH SPEED SUCCESSIVE APPROXIMATION RETURN PATH AND DATA CONVERSION METHODS AND CIRCUITS USING THE SAME" currently pending U.S. patent application Ser. No. 09/919,410, filed Jul. 30, 2001 by inventor Somayajula, entitled "ANALOG TO DIGITAL CONVERSION CIRCUITS, SYSTEMS AND METHODS WITH GAIN SCALING SWITCHED-CAPACITOR ARRAY" currently pending U.S. patent application Ser. No. 09/918,852, filed Jul. 30, 2001 by inventor Somayajula, entitled "CIRCUITS AND METHODS FOR LINEARIZING CAPACITOR CALIBRATION AND SYSTEMS USING THE SAME", currently pending;

U.S. patent application Ser. No. 09/918,616, filed Jul. 30, 2001 by inventor Somayajula, entitled "HIGH SPEED, LOW-POWER SHIFT REGISTER AND CIRCUITS AND METHODS USING THE SAME" currently pending; and U.S. patent application Ser. No. 09/919,021, filed Jul. 30, 2000 by inventor Somayajula, entitled "METHODS AND CIRCUITS FOR COMPENSATING FOR FINITE COMMON MODE REJECTION IN SWITCHED CAPACITOR CIRCUITS" currently pending.

FIELD OF INVENTION

The present invention relates in general to switched capacitor circuits and in particular to circuits and methods for latch metastability detection and compensation and systems using the same.

BACKGROUND OF INVENTION

One particular technique for performing analog to digital (A/D) conversion is through successive approximation. The basic successive approximation A/D converter (ADC) includes an analog comparator and a clocked feedback loop having a successive approximation register (SAR) and a digital to analog converter (DAC).

Generally, the analog input signal voltage is sampled onto an array of weighted capacitors, during the sampling phase, the top plates of which are coupled to one comparator input. The other comparator input is coupled to a comparison voltage, which could be a fixed reference voltage in a single-ended system or the voltage at the top plates of second capacitor array in a differential system.

During the first clock cycle of the subsequent conversion phase, the bottom plate of the capacitor representing the digital most significant bit (MSB) is coupled to a reference voltage while the bottom plates of the remaining capacitors in the array are coupled to ground or a second reference voltage (ground will be assumed here). The new top plate voltage appears at the input of the comparator and is compared against the comparison voltage. The new top plate voltage is a scaled version of $$\left[\frac{Voef}{2} - ain\right] \cdot k$$

where k is the ratio of capacitors. The sign of this quantity is the factor of interest. If the new top plate voltage is below the comparison voltage, then the MSB is "kept" by the SAR in the feedback loop by maintaining its bottom plate coupled to the reference voltage. On the other hand, if the top plate voltage is above the comparison voltage, the SAR couples and the bottom plate of the MSB capacitor to ground. The state of the MSB capacitor represents the MSB of the digital output word as a Logic 1. The bottom plate of the second MSB is then coupled to the reference voltage and the same test is performed to determine the state of the next digital code bit. The successive approximation algorithm continues by repeating this procedure for the remaining capacitors in the array such that the voltage difference at the inputs to the comparator converge to zero. At the end of this bit cycling process, the configuration of the switches coupling the bottom plates either to Vref or Gnd represents the input sample in digital form.

Successive approximation A/D converters are useful a wide range of applications, including data acquisition, test equipment, instrumentation, cellular communications, among others. Notwithstanding, in order to improve and broaden the utility of this type of A/D converter, significant challenges remain to be addressed. These challenges include improving the device speed given a set of process constraints, reducing the coding error rate, handling metastable states and calibration of the DAC.

SUMMARY OF INVENTION

Principles of the present invention are disclosed in circuits and methods for detecting and compensating for metastability in a regenerative latch. These circuits are particularly useful in charge redistribution analog to digital converters and similar high performance application, although not necessarily limited thereto.

According to one embodiment of the present inventive concepts, metastability compensation circuitry is disclosed for detecting and compensating for metastable states of a regenerative latch in a charge redistribution analog to digital converter. First and second latches each have a selected threshold voltage monitor corresponding first and second outputs of the regenerative latch. Detection and suppression logic detects a selected output state of the first and second latches corresponding to a metastable state of the regenerative latch and generates an output of a selected logic level in response.

Metastability in regenerative latches can present a significant problem in high performance applications such as analog to digital converters. Specifically, metastability can increase the conversion error rate, especially at high data conversion rates, to unacceptably high levels. The present inventive principles allow for the detection of metastable states in such a latch as well as for the compensation of the detected error in the resulting digital output code.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIG. 1–7 of the drawings, in which like numbers designate like parts.

Figure 1:
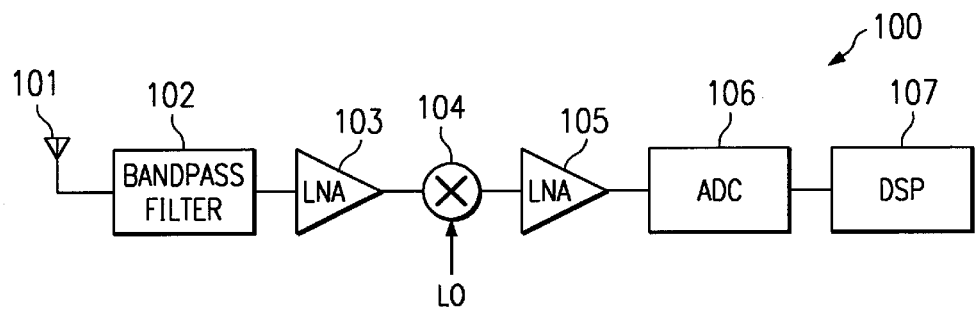
FIG. 1 is a high level block diagram of a digital receiver suitable for describing the principles of the present invention.

FIG. 1 is a high level block diagram of a digital receiver 100 suitable for describing the principles of the present invention. Generally, receiver 100 includes an RF input port or antenna 101 for receiving an RF signal, such as those used in telecommunications, and radio and television transmission. The desired RF signal is then extracted from the received signal by a bandpass filter 102. A low noise amplifier (LNA) 103 sets the system noise figure before the RF signal is downconverted in frequency by a mixer stage 104 operating in response to a local oscillator (LO). The output of mixer stage 104 may be passed through a second low noise amplifier (LNA) 105 before conversion into the digital domain.

In system 100, analog to digital conversion is performed using analog to digital converter (ADC) 200 discussed in detail below. Once converted into the digital domain, the received data can be processed using a digital signal processor (DSP) subsystem 106.

Figure 2:
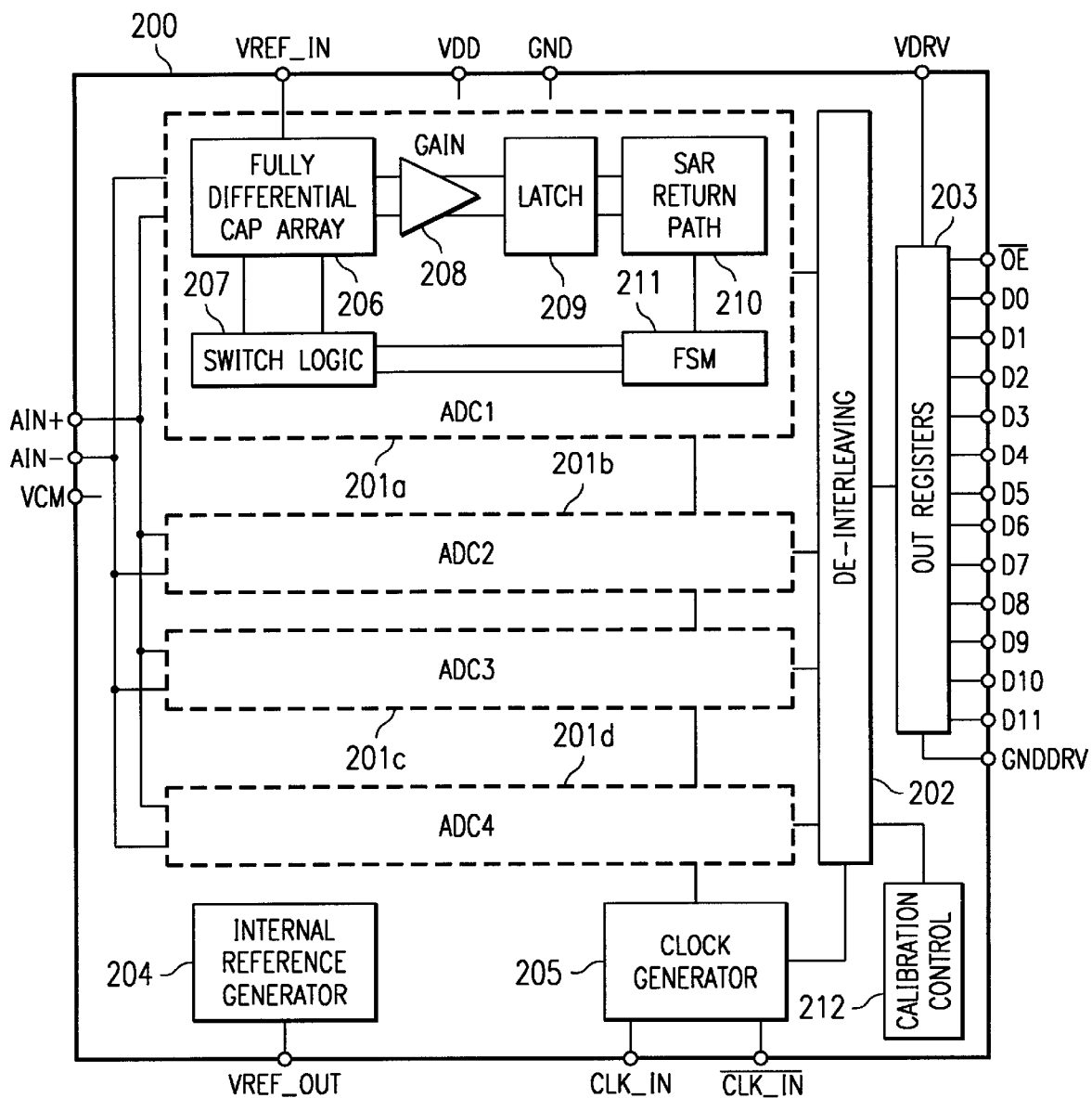
FIG. 2 is a high level functional block diagram of a single-chip analog to digital converter suitable for describing the present inventive concepts.

FIG. 2 is a high level functional block diagram of a single-chip analog to digital converter 200 suitable for describing the present inventive concepts. A/D converter 200 is based on 4 interleaved successive-approximation A/D converters (ADCs) 201, which will be discussed further below. The digitally coded samples are de-interleaved in block 202 and output through output register 203. A/D converter 200 also includes an on-chip reference voltage generator 204, clock generator 205 and clock generation circuitry 206.

Each of the ADCs 202 includes a fully differential capacitor array 206 under control of switch control circuitry 207 which implements the charge redistribution DAC discussed below. During the tracking mode, capacitor array 206 samples the input voltage at the differential analog inputs AIN+ and AIN−. During the hold mode, the sampled charge is held while the successive approximation algorithm generates the digital bits.

A gain stage 208 with minimal gain provides signal isolation in front of latch (comparator) 209. SAR return path 210 and FSM 211 feedback determine whether a bit is kept (i.e. corresponding capacitor remains coupled to the reference voltage) or not kept (i.e. the corresponding capacitor is recoupled to ground).

In a conventional charge redistribution DAC, the bottom plate of a graduated (bit-weighted) filter array is coupled to the input during the sampling phase and all capacitors are charged to the input signal voltage. After the capacitors are charged, their bottom plates are coupled to ground during hold phase such that the top plates of the capacitors are at a voltage $V_X$ which is approximately equal to $A_{IN}$, where $A_{IN}$ is the input sample voltage. During bit cycling, the bottom plate of the capacitor representing the MSB is coupled to the reference and the voltage of the top plate compared against the reference. The bottom capacitors of the remaining capacitors remain coupled to ground to form a voltage divider. If upper plate voltage is now below the reference, then the MSB capacitor continues to be coupled to the reference (i.e. the bit is kept), otherwise the bottom plate of the capacitor is recoupled to ground (i.e. the bit is not kept).

Figure 3:
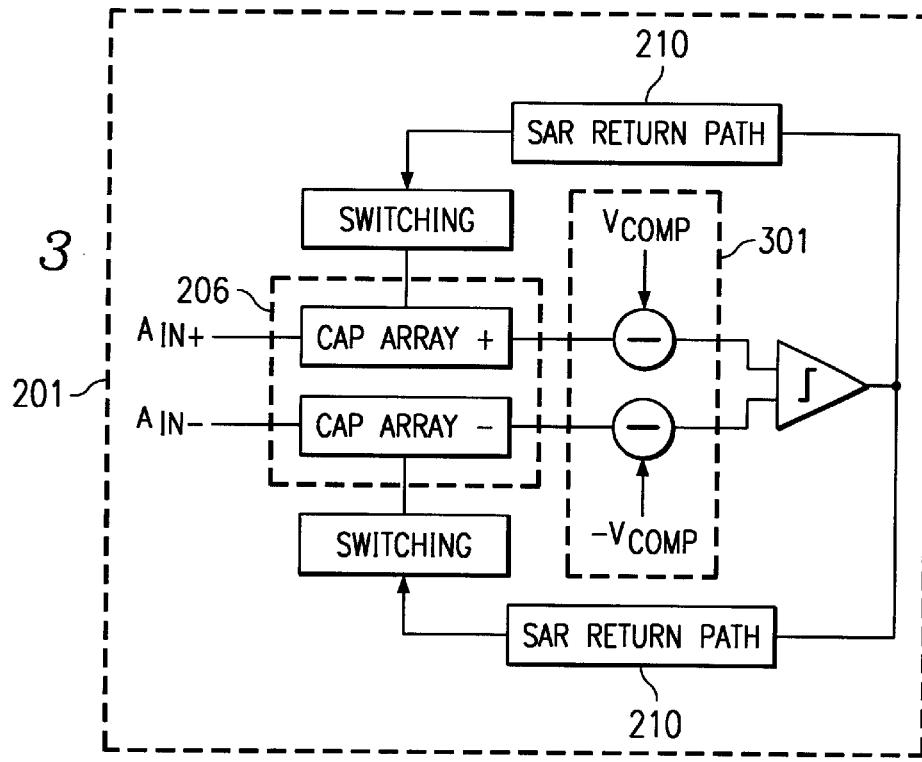
FIG. 3 is a high-level functional block diagram of an analog to digital converter with voltage offset compensation circuitry.

One circuit embodiment of the principles of the present invention is shown in FIG. 3. In this case, an error cancellation (compensation) stage 301, which is preferably a subtractor, is placed in front of the comparator. This cancellation stage presents a voltage to the comparator inputs, as determined during a calibration procedure, and cancels out the input voltage offset. Cancellation stage 301 performs the cancellation operation in the analog domain, although its control is performed in the digital domain. A preferred charge redistribution DAC suitable with an integral offset compensation (cancellation) circuitry is discussed below in conjunction with FIG. 4. It should be noted that the present invention is not limited to error compensation loops utilizing charge redistribution DACs. In alternative embodiments, the DAC can also be a resistor-based DAC or a current-based DAC.

Figure 4A:
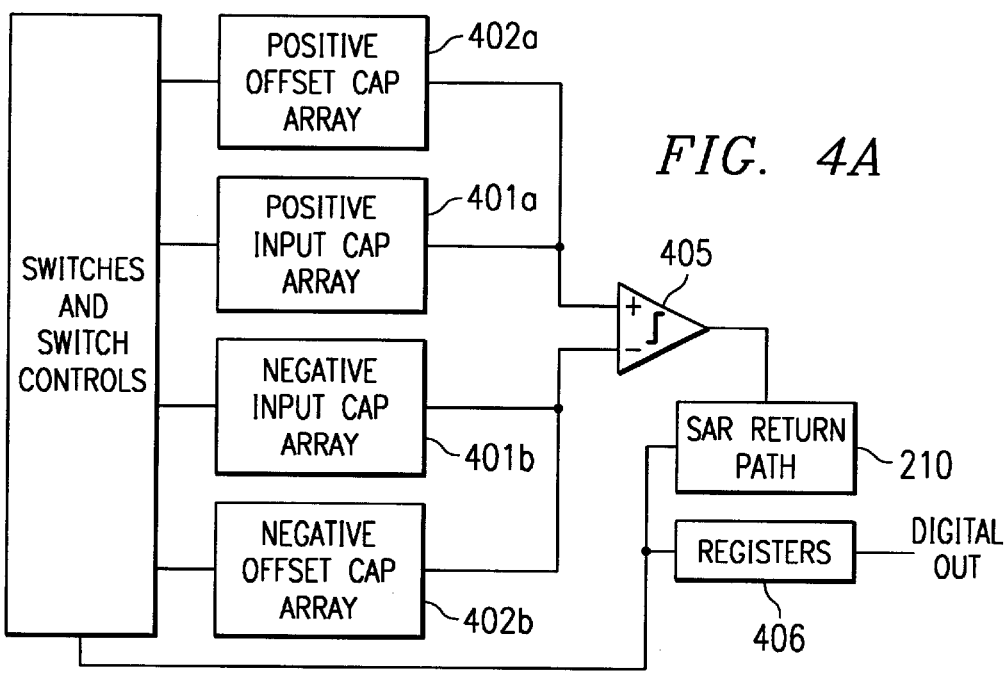
FIG. 4A is a functional block diagram of a switched-capacitor charge redistribution ADC embodying the present principles.
Figure 4B:
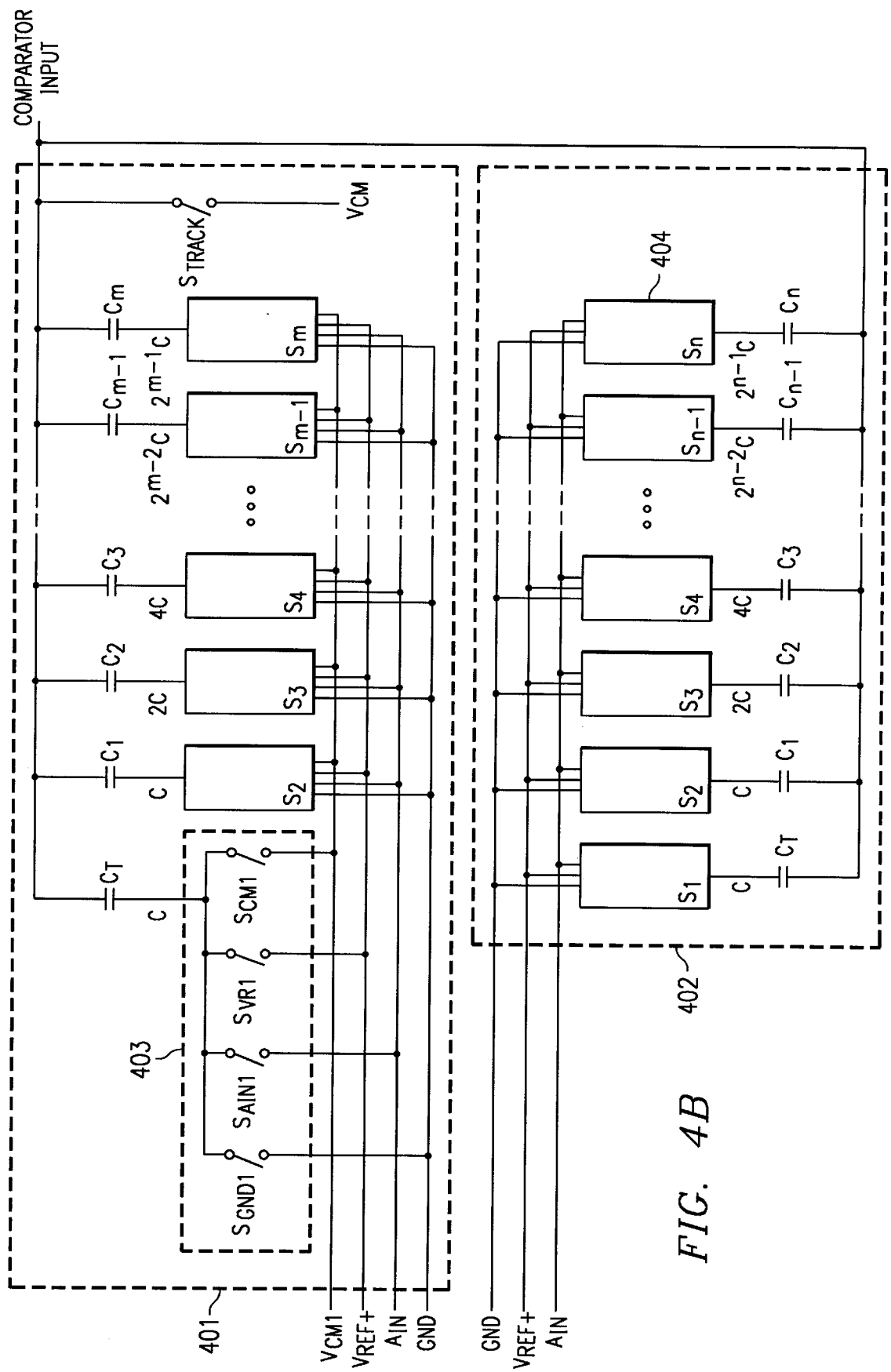
FIG. 4B illustrates one pair of the capacitor arrays of FIG. 4A, in further detail.

A switched-capacitor charge redistribution DAC 400 embodying the present principles is shown in FIG. 4A. In this embodiment, two capacitor arrays are provided for each of the paths into the positive and negative differential inputs into comparator 404, namely, Input Capacitor Array 401 and Offset Compensation Capacitor Array 402. One pair of arrays 401 and 402 is shown in further detail in FIG. 4B. Input Capacitor Array 401 comprises a termination capacitor $C_T$ and an array of capacitors $C_{INi}$, i=1 to m graduated in the sequence C, 2C, 4C, ... $2^{m-2}$C, $2^{m-1}$C(ff). In the following discussion, input capacitors 401 coupled to the positive comparator input are designated $C_{INPi}$ and those coupled to the negative comparator input designated $C_{INNi}$. Generally, the termination capacitors do not participate in the bit-cycling process, except during capacitance calibration (trim) operations.

Offset Compensation Capacitor Array 402, comprises a termination capacitor $C_T$ and an array of capacitors $C_{OFFj}$, j=1 to n, graduated in the sequence C, 2C, 4C, ... $2^{n-2}$C, $2^{n-1}$C(ff). Offset capacitors coupled to the positive comparator input are designated $C_{OFFPj}$ and those coupled to the negative comparator input $C_{OFFNj}$.

The bottom plate of each capacitor in array 401 is associated with a set of switches 403, one of which is shown in further detail. Specifically, each input array switch set includes a switch $S_{AINi}$ for coupling the plate to the analog input voltage $A_{IN+}$ or $A_{IN-}$, a switch $S_{VRi+}$ for coupling to the positive reference voltage rail $V_{REF+}$, a switch $S_{GNDi}$ for coupling to the negative reference rail $V_{REF-}$, in this case GND, and a switch $S_{CMi}$ for coupling to the input common mode voltage $V_{CMi}$ referenced to the differential inputs $A_{IN+}$ and $A_{IN-}$.

A similar set of switches 404, indexed j=1 to m, selectively couple the bottom plates of the capacitors of offset array 402 to the input signal ($A_{IN+}$ or $A_{IN-}$) and the reference voltage ($V_{REF+}$) and GND. After the SAR bit cycling process, the state of switches 403 represent the digitally coded input sample and is stored in registers 406 for output.

An offset calibration cycle is run to selectively charge the capacitors of the offset arrays 402a,b at the positive and negative inputs to the comparator. In the following discussion, "complementary" sets of capacitors are those coupled by the appropriate switches at a given instant to opposing reference voltages. For example, if capacitor $C_{INPi}$ in input array 401a at the positive comparator input is coupled to $V_{REF}$, then the corresponding capacitor in $C_{INi}$ in input array 401b at the negative comparator input is coupled to GND, and vice versa. Similarly, if a capacitor $C_{OFFPj}$ in offset array 402a is coupled to $V_{REF}$, capacitor $C_{OFFNj}$ in offset array 402b is coupled to GND, and vice versa.

During the sampling phase of the calibration procedure, the bottom plates of all input capacitors $C_{INPi}$(i=1 to m) and $C_{INi}$(i=1 to m) are coupled to the input common mode voltage $V_{CMi}$. The MSB capacitor $C_{OFFMSBP}$ of the positive path capacitor array is coupled to $V_{REF}$ and the complementary MSB capacitor $C_{OFFMSBN}$ is coupled to Gnd. The bottom plates of the remaining positive path offset capacitors $C_{OFFLSBP}$ are coupled to ground and those of the remaining negative path offset capacitors $C_{OFFLSBN}$ are coupled to $V_{REF}$. The top plates of all the input and offset capacitors, for both paths are coupled to a common voltage according to the comparator design. For a more complete discussion of the compensation, reference is now made to copending, coassigned patent application Ser. No. 09/919, 181 incorporated above by reference.

During the calibration conversion phase, a SAR bit cycling process is then performed using only the offset capacitors $C_{OFFPj}$ and $C_{OFFNj}$. The bits on the offset capacitors approximate the inverse of the offset voltage $V_{OFF}$. During this process, the bottom plates of the input capacitors remains coupled to $V_{cmi}$. The calibration conversion phase is illustrated in FIG. 5.

A SAR bit cycling operation is then performed through the input capacitors $C_{INPi}$ and $C_{INNi}$. During the normal operation conversion phase, the offset capacitors $C_{OFFPj}$ and $C_{OFFNj}$ are selectively coupled to $V_{REF}$ and ground to reflect the offset compensation codes determined during the calibration operations.

Figure 5:
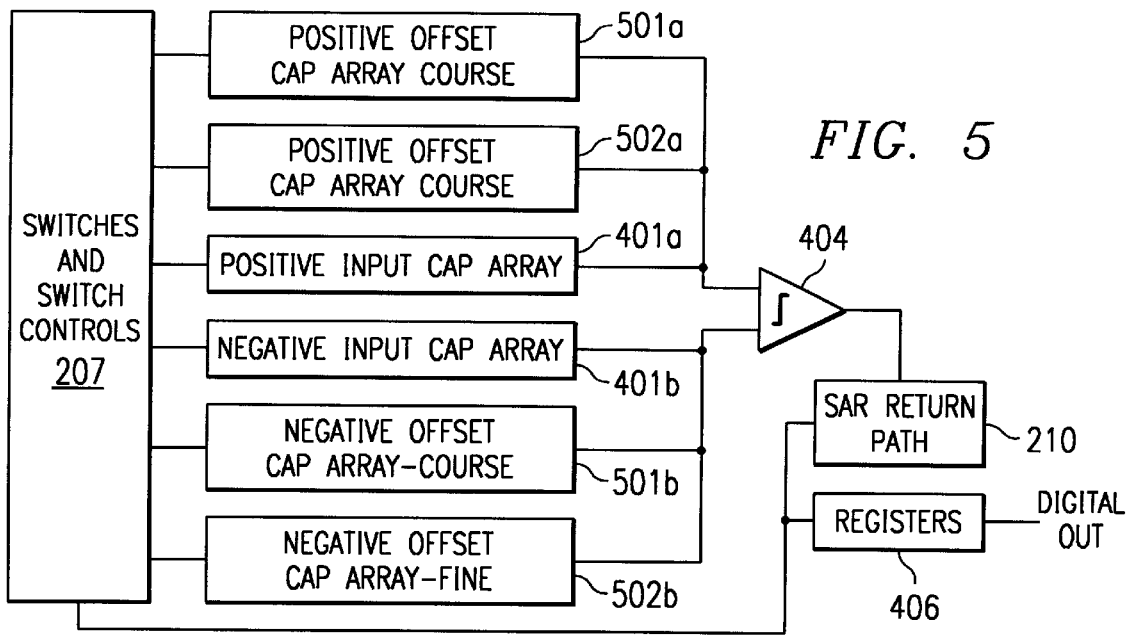
FIG. 5 is a functional block diagram of a second charge redistribution ADC embodying the present principles.

An alternate embodiment is depicted in FIG. 5 Here, two offset arrays are provided at each of the comparator inputs. Specifically, each input is associated with a coarse offset array 501 and a fine offset array 502. Structurally, these arrays are similar to offset arrays 402 discussed above and include an array of weighted capacitors and a corresponding set of switches. The number of weighted capacitors in the coarse and fine arrays are not necessarily equal. For example, the coarse array could be an 5-bit array and the fine array a 8-bit array.

During the sampling phase of calibration, the MSB capacitors of the both coarse and fine arrays of the positive input path are coupled to $V_{REF}$ while the MSB capacitors of the coarse and fine arrays of the negative input path are coupled of Gnd. The remaining capacitors in both the coarse and fine arrays of the positive input path are coupled to Gnd while those of the negative input path are coupled to $V_{REF}$. The input capacitors sample $V_{CMi}$ as discussed above.

During the calibration conversion phase, a bit cycling operation is first performed through coarse arrays 501 followed by a bit cycling operation through the fine arrays 502. The results are coarse and fine offset codes for the positive and negative input paths.

The normal mode sample conversion is performed in a manner similar to that discussed above. During the sampling phase, with the MSB capacitors of the fine and coarse offset compensation arrays of the positive path coupled to $V_{REF}$ and those of the fine and coarse offset compensation arrays of the negative path coupled of Gnd. The remaining (LSB) capacitors of the positive path fine and coarse arrays are coupled to Gnd the remaining (LSB) capacitors of the negative path coupled to $V_{REF}$.

During the normal mode conversion phase, the offset codes determined during calibration are set into the fine and coarse arrays of both the positive and negative input paths. A bit cycling is then performed through the input capacitor arrays $C_{INTOTN}$ and $C_{INTOTP}$, as previously described.

A regenerative latch operates in two phases, namely reset and regeneration. During reset, the complementary outputs are shorted to erase the last state of the latch and prepare it for the next decision. During the regeneration phase, the outputs are released and the voltage difference at the differential inputs start the outputs swinging towards opposite voltage rails. (In a conventional system, only one of the two outputs is used by the return path logic to make the keep/don't keep decision.) The regeneration phase can be generally described as:

$$V_O = V_{in} e^{T/\tau} \qquad (2)$$

where:

$V_{in}$ is the voltage difference betwen the differential inputs;

T is the time allotted for regeneration; and

τ is the regeneration time constant.

Thus, for example, if the latch regeneration time constant τ is 60 picoseconds, a signal across the differential inputs as small $3.72 \times 10^{-44}$ V as can be regenerated to 1 V in approximately 6 nanoseconds. Notwithstanding, for most high speed applications, 6 nanoseconds is usually not available for latch regeneration. For example, in ADC 200, the preferred target regeneration time is 1.5 nanoseconds at most, which only allows a gain of roughly $7.2 \times 10^{-10}$ V for the same time constant.

In a charge redistribution ADC, sufficient latch gain is critical to avoiding errors from a metastable condition. In the present discussion, metastability denotes the condition where the input voltage fails to drive the output voltage difference between the differential outputs to at least 1 volt within the 1.5 nanosecond target time frame. The problem of metastability is particularly troublesome when the smaller capacitors, and consequently smaller voltages, are coupled to the comparator inputs for resolving the LSBs.

When the MSBs are being tested, the voltage difference at the differential comparator inputs can be as high as $\pm A_{IN}/2$ V (4 V full scale). For the latch described above, an input signal within this range of a small as $7.2 \times 10^{-10}$ V can be amplified to 1 V within 1.5 nanoseconds. The probability of a metastable state occurring under this condition is approximately:

$$\frac{7.2 \times 10^{-10} \text{ V per conversion}}{4 \text{ V}} = 1.8 \times 10^{-10} \text{ per conversion}$$

For the bit MSB-1, the input range reduces by a factor of 2 and consequently the probability of a metastable state doubles over that calculated above for the MSB. Similarly, for the bit MSB-2, the input voltage range decreases by a factor of 4 and the probability of a metastable state occurring increases by a factor of 4 over that of the MSB, and so on. It should be noted that, at least for one or more of the LSBs, some of this effect is alleviated by the SAR feedback loop latency which provides more time for LSB latch regeneration.

Generally, the total probability per sample conversion of a metastability error will be proportional to the sum of the probabilities for each of the bits. For a 12b system with a maximum regeneration time of 1.5 nanoseconds, the error probability is roughly $1 \times 10^{-8}$/conversion. When operating at a bit rate of 60 maps, this equates to approximately 44 errors per second, which is clearly unacceptable for high performance ADC systems.

It should be noted that even if the latch outputs fully switch to the wrong state for a given bit the remaining capacitors in the array will limit the error in the output code through the bit-cycling to ±LSB/2 V. A metastable state on the other hand may leave the bit being tested between decision voltages at the end of the regeneration period and consequently the switches controlling the bottom plate of the capacitor being tested may only partially switch or may not switch at all.

Figure 6:
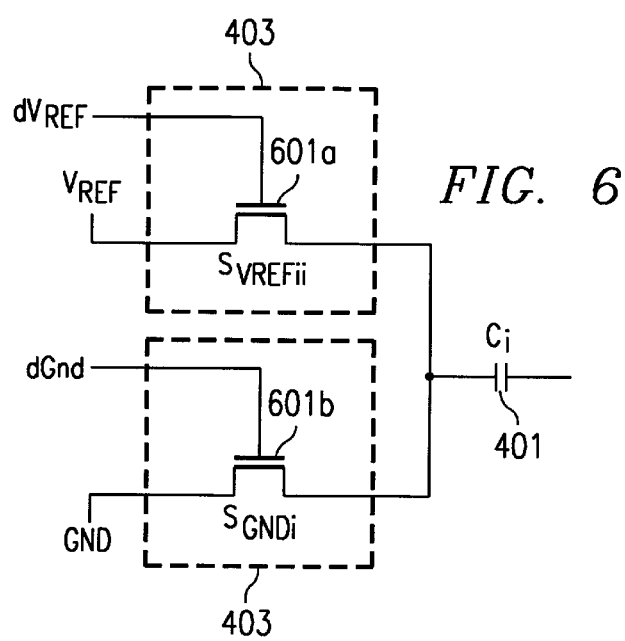
FIG. 6 is an electrical schematic diagram illustrating in further detail selected switches $S_{GNDi}$ and $SV_{REFi}$, which control the bottom-plate voltage for a selected one of the input capacitors of FIG. 4B.

FIG. 6 illustrates in further detail selected switches $S_{GNDi}$ and $SV_{REFi}$, which control the coupling of the bottom plates of capacitor $C_i$ to Gnd and $V_{REF}$ during the SAR bit-cycling process. In this example, NMOS transistors 601a,b are assumed to be the switches, although this is not necessarily true for all embodiments of the invention. The control signals $dV_{REF}$ and dGnd are complementary, with $dV_{REF}$ active when the decision is to keep $C_i$ coupled to $V_{REF}$ and dGnd active when the decision is to recoupled $C_i$ to ground (Not Keep).

If $V_{REF}$ is taken to be nominally 2 V, then a minimum voltage of approximately 3.8 V is required to turn-on NMOS transistor 601a to settle capacitor $C_i$ to a sufficient voltage. This must be done before latch 209 resets in anticipation of deciding the state of the next bit. Notwithstanding, small input voltages may not sufficiently swing the output voltage to the required level to turn-on transistor 601a within the required time frame and the metastable state previously described occurs.

Figure 7:
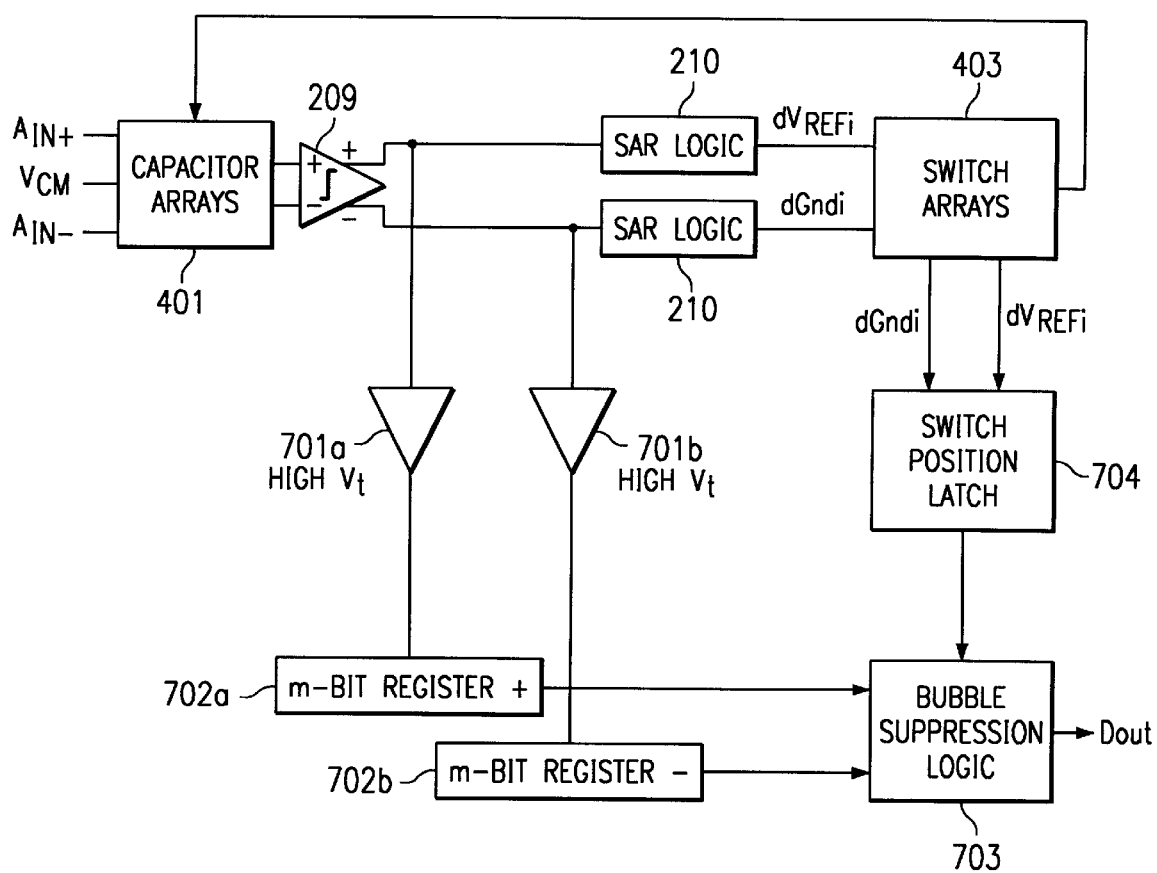
FIG. 7 depicts preferred circuitry for detecting and compensating for metastable states in a regenerative latch according to the inventive concepts.

FIG. 7 depicts preferred circuitry for detecting and compensating for metastable states in a corresponding regenerative latch 209. According the inventive concepts, both the differential outputs of the latch are coupled to a high threshold voltage (Vt) latch 701a,b. For example, if the voltage required to turn-on transistor 601a is 3.8 V, the threshold voltage for latches 701a,b could be, for example 4 V+/−200 mV.

The complementary outputs from high threshold latches 701a,b are stored for each bit decision within in a corresponding set of registers 702a,b. In the present example where input arrays 401a,b each represents m-number of bits, registers 702a,b are m-number of bits wide. The outputs of these registers are processed by bubble suppression logic 703 will force one or more output bits $D_{OUT}$ in the event of metastability, as described below.

When a bit is being tested, the corresponding capacitor in array 402 is initially coupled to $V_{REF}$ by SAR logic (return path) 210. If, for a given bit decision, the output of either side of latch 209 swings above the threshold level set by the corresponding high $V_t$ latch, that decision is valid (i.e. latch 210 is not metastable). If the + differential output swings high and is valid, the corresponding bit in register 702a sets to a logic one and the complementary bit in register 702b resets to a logic 0. In this case, SAR logic 210 keeps $SV_{REFi}$ on and the associated switch $S_{GNDi}$ off in the corresponding switch set 403. On the other hand, if the − output swings high and is valid, the corresponding bit in register 702b sets to a logic one and the complementary bit in register 702a resets to a logic 0. Here, the corresponding switch $S_{GNDi}$ turns-on and switch $SV_{REFi}$, turns-off. For a valid bit decision, the switch positions for $SV_{REFi}$ and $S_{GNDi}$ represent the bit in the output code and is registered in registers 704.

When a metastable condition occurs in latch 210, neither of its differential outputs reach the thresholds of high $V_t$ latches 702a,b. In this case, both registers 702a,b reset to a logic zero for the bit being tested. A "bubble" has therefore occurred which is processed by bubble suppression circuitry 703. Preferably, bubble suppression circuitry 703 forces the current bit at the output $D_{OUT}$ to a logic zero and all the successive (lesser significant bits) are forced to logic ones, notwithstanding the bit positions registered in switch position latches 704.

Consider a 8-bit system where a bubble occurs at bit 4, as described in Table 1.

TABLE 1

| i = | $dV_{REF}$ | dGnd | $D_{OUT}$ |
|---|---|---|---|
| 8 (MSB) | 0 | 1 | 0 |
| 7 | 0 | 1 | 0 |
| 6 | 1 | 0 | 1 |
| 5 | 1 | 0 | 1 |
| 4 | 0 | 0 | 0 |
| 3 | x | x | 1 |
| 2 | x | x | 1 |
| 1 (LSB) | x | x | 1 |

(x = don't care).

Here, SAR logic 210 makes the appropriate decisions and sets the corresponding switches 403 for Bits 5–8 in the normal manner. The switch positions for Bits 5–8 are registered in register 704, also in the normal manner.

SAR logic 210 continues the bit cycling procedure for bits 1–4. However, at Bit 4 a bubble occurs since the outputs of high $V_t$ latches 703a,b are both zero (i.e. neither side of latch 209 has reached approximately 4 volts before reset). The output $D_{OUT}$ for Bit 4 is consequently forced to a logic zero and those of subsequent Bits 1–3 to a logic one by bubble suppression logic 703. The full 8-bit output code is that shown in the $D_{OUT}$ column of TABLE 1.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. Metastability compensation circuitry for detecting and compensating for metastable states of a regenerative latch in a charge redistribution analog to digital converter comprising:

first and second latches each having a selected threshold voltage for monitoring corresponding first and second outputs of the regenerative latch;

detection logic for detecting a selected output state of said first and second latches corresponding to a metastable state of the regenerative latch; and suppression logic for forcing a first output bit of the analog to digital converter to a selected logic level in response to the detection of a metastable state by said detection logic and for maintaining a second output bit at a present logic level.

2. The metastability compensation circuitry of claim 1 wherein the threshold voltage of said first and second latches is selected as function of switching threshold voltages of the analog to digital converter.

3. The metastability compensation circuitry of claim 1 and further comprising register coupled to a selected one of said first and second latches.

4. The metastability compensation circuitry of claim 1 wherein said detection logic detects a metastable state when outputs of both said first and second latches are logic zeros.

5. The metastability compensation circuitry of claim 1 wherein said suppression logic is operable to force an output to a selected logic level for representing a current bit and an output to a selected logic level for representing a subsequent bit and to maintain an output at a present logic level for representing a prior bit.

6. A method of compensating for metastability in a charge redistribution analog to digital converter including a regenerative latch comprising the steps of:

for a current bit being processed by the converter, comparing first and second outputs of the regenerative latch against a preselected threshold voltage;

in response to said step of comparing, forcing an output of the analog to digital converter representing the current bit to a selected logic state when the first and second outputs of the regenerative latch are below the preselected threshold voltage; and in response to said step of comparing, forcing an output of the analog to digital converter representing a subsequent bit to a selected logic state when the first and second outputs of the regenerative latch are below the preselected threshold level.

7. The method of claim 6 wherein:

said step of forcing the output representing the current bit comprises the step of forcing the output to a logic zero; and said step of forcing the output representing the subsequent bit comprises the step of forcing the output to a logic one.

8. The method of claim 6 wherein the analog to digital converter includes an array of a plurality of capacitors coupled to an input of the regenerative latch and a plurality of switches for selectively coupling the capacitors to preselected reference voltage levels and further comprising the step of:

selecting the preselected threshold voltage for said step of comparing as a function of a turn-on voltage of the switches.

9. The method of claim 6 wherein said step of comparing comprises the step of presenting voltages at the first and second outputs of the regenerative latch to the inputs of corresponding first and second latches having threshold voltages set to the preselected threshold voltage.

10. The method of claim 6 wherein the analog to digital converter includes a capacitor coupled to an input of the regenerative latch and representing the current bit and a switch selectively coupling the capacitor to a preselected reference voltage and further comprising the steps of:

in response to said step of comparing, generating an output representing the current bit from the state of the switch when a voltage at one of the first and second outputs of the regenerative latch exceeds the preselected threshold.

11. An analog to digital converter comprising:

an array of capacitors;

a plurality of switches for selectively coupling first plates of said capacitors to an input during a sampling phase and to selected reference voltages during conversion phase bit-cycling;

a regenerative latch having an input coupled to second plates of said capacitors for comparing a voltage at said second plates of said capacitors against a voltage at a second input of said latch;

a return path for controlling said plurality of switches in response to an output of said latch; and metastability compensation circuitry comprising:

level detection circuitry having a preselected threshold voltage coupled to the output of said regenerative latch; and bubble suppression circuitry coupled to the level detection circuitry for forcing an output of said analog to digital converter to a selected logic state when the output of the regenerative latch is below the preselected threshold voltage for a current bit being tested.

12. The analog to digital converter of claim 11 wherein said bubble suppression circuitry is further operable to force an output representing a subsequent bit to a selected logic state when the output of the regenerative latch is below the preselected threshold level.

13. The analog to digital converter of claim 11 wherein said level detection circuitry comprises a high threshold voltage latch.

14. The analog to digital converter of claim 11 wherein said regenerative latch comprises first and second differential outputs and said level detection circuitry comprises a first latch of the preselected threshold voltage coupled to the first differential output and a second latch of the preselected threshold voltage coupled to the second output.

15. The analog to digital converter of claim 11 and further comprising:

a second array of capacitors having first plates coupled to a second input of said regenerative latch; and a second plurality of switches for selectively coupling second plates of said second array of capacitors to an input during the sampling phase and to selected reference voltages during conversion phase bit cycling.

16. The analog to digital converter of claim 11 and further comprising at least one offset compensation capacitor array coupled to said input of said regenerative latch in parallel with said array of capacitors.

17. The analog to digital converter of claim 11 wherein said return path comprises a successive approximation register.

18. The analog to digital converter of claim 11 and further comprising a register coupling said level detection circuitry and said bubble suppression circuitry.

* * * * *